United States Patent [19]

Uemura et al.

[11] Patent Number: 6,010,782

[45] Date of Patent: *Jan. 4, 2000

[54] THIN ADHESIVE SHEET FOR WORKING SEMICONDUCTOR WAFERS

[75] Inventors: Gosei Uemura; Yoshinari Satoda; Eiji Shigemura, all of Osaka, Japan

[73] Assignee: Nitto Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/934,104

[22] Filed: Sep. 19, 1997

Related U.S. Application Data

[63] Continuation of application No. 08/578,397, Dec. 26, 1995, abandoned, which is a continuation of application No. 07/665,846, Mar. 7, 1991, abandoned, which is a continuation of application No. 07/045,733, May 1, 1987, abandoned, which is a continuation-in-part of application No. 06/710,828, Mar. 12, 1985, abandoned.

[30] Foreign Application Priority Data

Mar. 12, 1984 [JP] Japan ................................. 59-47743

[51] Int. Cl.$^7$ ...................................... B32B 7/12
[52] U.S. Cl. ........................ 428/343; 428/345; 428/355
[58] Field of Search .................................. 428/343, 345, 428/355

[56] References Cited

U.S. PATENT DOCUMENTS

| 4,312,916 | 1/1982 | Kakumaru et al. | 428/345 |
|---|---|---|---|
| 4,379,201 | 4/1983 | Heilmann et al. | 428/345 |
| 4,522,870 | 6/1985 | Esmay | 428/252 |
| 5,637,395 | 6/1997 | Uemura et al. | 428/343 |
| 5,714,029 | 2/1998 | Uemura et al. | 156/275.5 |

FOREIGN PATENT DOCUMENTS

| 58-50164 | 9/1983 | Japan . |
|---|---|---|
| 59-21038 | 2/1984 | Japan . |

*Primary Examiner*—William Krynski
*Assistant Examiner*—J. M. Gray
*Attorney, Agent, or Firm*—Sughrue, Mion, Zinn, Macpeak and Seas, PLLC

[57] ABSTRACT

A thin adhesive sheet for working semiconductor wafers is described, comprising a light-permeable support and a pressure-sensitive adhesive layer on the support, wherein the adhesive layer is a composition comprising 100 parts by weight of a base polymer, from 1 to 100 parts by weight of a low molecular weight compound containing at least two photopolymerizable carbon—carbon double bonds in the molecule, and from 0.1 to 5 parts by weight of a photopolymerization initiator. This adhesive sheet is firmly bonded to a semiconductor wafer during the wafer cutting process, the adhesive force of the adhesive sheet is markedly reduced. As a result, the pick-up operation can be carried out easily. This adhesive sheet is useful in working semiconductor wafers.

3 Claims, No Drawings

THIN ADHESIVE SHEET FOR WORKING SEMICONDUCTOR WAFERS

This is a Continuation of application Ser. No. 08/578,397 filed Dec. 26, 1995 (now abandoned), which is a Continuation of application Ser. No. 07/665,846 finded Mar. 7, 1991 (now abandoned), which is a Continuation of application Ser. No. 07/045,733 filed May 1, 1987 (now abandoned), which is a Continuation in Part of application Ser. No. 06/710,828 (now abandoned) filed Mar. 12, 1985.

FIELD OF THE INVENTION

The present invention relates to a thin adhesive sheet for working semiconductor wafers. More particularly, it is concerned with a thin adhesive sheet which is used to protect the surface of a semiconductor wafer with IC elements formed thereon during the polishing step, or to fix the wafer when cutting and separating the semiconductor wafer into the IC element chips.

BACKGROUND OF THE INVENTION

In production of semiconductor wafers, the back of a semiconductor wafer with IC elements formed thereon is generally polished to make the wafer as thin and uniform as possible. For example, the thickness of the wafer is decreased from about 0.5 mm to from about 0.2 to 0.3 mm by such a polishing.

Various techniques have been employed to prevent the breakage of the semiconductor wafer or damage of the wafer surface: (a) a method comprising coating a paint on the surface of the wafer to form a coating, polishing the back of the wafer and removing the coating with a solvent, (b) a method comprising laminating a thin sheet on the surface of the wafer as a spacer, polishing the back of the wafer and removing the sheet, and (c) a method comprising applying a pressure-sensitive thin adhesive sheet to the surface of the wafer, polishing the back of the wafer and peeling off the thin adhesive sheet.

In cutting and separating the semiconductor wafer into IC element chips, a method comprising forming wedge-shaped grooves of low depth on the surface of the semiconductor wafer in conformity with the shape of the desired IC chip and dividing the semiconductor wafer into the IC element chips by applying an external force has been employed. This method, however, has disadvantages in that the separation accuracy is poor, and productivity is low since the IC element chips after cutting and separating must be transferred to the subsequent mounting step by the hand.

For this reason, the direct pick-up method has now been employed, comprising fixing the semiconductor wafer by bonding thereto a thin adhesive sheet, cutting the assembly into the IC element chips by means of a rotary blade and picking up the IC element chips from the thin adhesive sheet while simultaneously mounting the chips.

In the above direct pick-up method, the semiconductor wafer is washed with water under a hydraulic pressure of at least 2 kg/cm$^2$ to remove a friction heat and scraps during cutting the semiconductor wafer with the rotary blade. Thus, it is required for the thin adhesive sheet to have a sufficient adhesive force to withstand the hydraulic force. If, however, the adhesive force is too large, it is difficult for the IC element chips to pick up from the thin adhesive sheet. For this reason, the adhesion force of the thin adhesive sheet is controlled so as to be capable of withstanding the above hydraulic pressure but not to lower the efficiency of the pick-up operation.

However, the adhesive force of the thin adhesive sheet can be controlled as described above only when the size of the final IC element chip is up to about 20 mm$^2$. In the case of IC element chips having a size of 50 mm$^2$ or more as a recent LSI having an increased degree of accumulation, it is difficult for the thin adhesive sheet to control the adhesive force as described above, and the above-described direct pick-up method cannot be applied.

SUMMARY OF THE INVENTION

Various investigations have been made to provide a thin adhesive sheet which can be used even when the size of the IC element chip is 50 mm$^2$ or more.

Accordingly, an object of the present invention is to provide a thin adhesive sheet for working semiconductor wafers, comprising a light-permeable support and provided thereon a pressure-sensitive adhesive layer which can cure by light irradiation, thereby forming a three-dimensional network structure.

DETAILED DESCRIPTION OF THE INVENTION

According to the thin adhesive sheet for working semiconductor wafers of the present invention, the adhesive force of the thin adhesive sheet can be increased to a sufficiently high level without bringing any specific attention to the efficiency of the pick-up operation after the wafer cutting process for the reason as described hereinafter. As a result, during the wafer cutting process, IC element chips are firmly bonded to the thin adhesive sheet and even if pressure of washing water is applied, the chips never drop from the thin adhesive sheet.

After the wafer cutting process, the pressure-sensitive adhesive layer is cured by irradiating with light from the support side of the thin adhesive sheet, thereby forming a three-dimensional network structure. By the formation of the three-dimensional network structure, the cohesive force of the adhesive layer increases and the adhesiveness thereof is substantially lost. As a result, the adhesive force of the thin adhesive sheet to the IC element chips is markedly reduced. Consequently, the pick-up operation can be carried out easily irrespective of the size of the IC element chip, viz., even if the size of the IC element chip is more than 50 mm$^2$.

When the thin adhesive sheet of the present invention is used, the direct pick-up system can be applied even if the size of the IC element chip exceeds 50 mm$^2$ and productivity does never decrease.

Examples of light-permeable support which can be used in preparing the thin adhesive sheet of the present invention include films of synthetic resins such as polyvinyl chloride, polyethylene terephthalate, polyethylene, and polypropylene. These films may be heat-shrinkable films. In addition, stretchable films made of polyolefins having rubber elasticity such as polybutene and 1,2-polybutadiene can also be used. The thickness of the film is generally from 10 to 300 µm.

The pressure-sensitive adhesive layer which can cure by light irradiation to form a three-dimensional network structure is prepared using a pressure-sensitive adhesive composition comprising a mixture of a rubber- or acryl-based pressure-sensitive adhesive, a low molecular weight compound having at least two photopolymerizable carbon—carbon double bonds in the molecule (hereinafter referred to as a "photopolymerizable compound") and a photopolymerization initiator.

The above rubber- or acryl-based pressure-sensitive adhesive is composed of, as a base polymer, rubbers such as natural rubber and various synthetic rubbers, or acryl-based polymers such as polyalkyl acrylate or methacrylate or copolymers comprising from about 50 to 99.5% by weight of alkyl (meth)acrylate and from about 50 to 0.5% by weight of an unsaturated monomer copolymerizable therewith, and if necessary, a cross-linking agent such as polyisocyanates or alkyletherized melamine compounds, in an amount of from 0.1 to 10 parts by weight per 100 parts by weight of the base polymer. The above base polymers, i.e., rubbers or acryl polymers, may have photopolymerizable carbon—carbon double bonds in the molecule.

The photopolymerizable compound preferably has a number average molecular weight of about 10,000 or less. In order that the pressure-sensitive adhesive layer may form a three-dimensional network structure with high efficiency by light irradiation, it is more preferred for the compound to have the molecular weight of about 5,000 or less and the number of photopolymerizable carbon—carbon double bonds in the molecule of from 2 to 6, particularly from 3 to 6. Particularly preferred examples of these photopolymerizable compounds are trimethylolpropane triacrylate, pentaerythritol triacrylate, pentaerythritol tetraacrylate, dipentaerythritol monohydroxypentaacrylate, and dipentaerythritol hexaacrylate. Other photopolymerizable compounds which can be used include 1,4-butanediol diacrylate, 1,6-hexanediol diacrylate, polyethylene glycol diacrylate, and commercially available oligoester acrylate.

These photopolymerizable compounds can be used alone or as mixtures thereof. The amount of the photopolymerizable compound used is generally in the range of from 1 to 100 parts by weight per 100 parts by weight of the base polymer. If the amount of the photopolymerizable compound used is too small, the three-dimensional network structure is formed only insufficiently by the light irradiation of the pressure-sensitive adhesive layer and reduction in the adhesion force of the thin adhesive sheet to the IC element chip is too small. On the other hand, if the amount thereof is too large, the plasticity of the resulting pressure-sensitive adhesive layer markedly increases and the necessary adhesive force cannot be obtained in the wafer cutting process.

Examples of the photopolymerization initiators which can be used include isopropyl benzoin ether, isobutyl benzoin ether, benzophenone, Michler's ketone, chlorothioxanthone, dodecylthioxanthone, dimethylthioxanthone, diethylthioxanthone, acetophenone diethylketal, benzyl dimethylketal, α-hydroxycyclohexyl phenyl ketone, and 2-hydroxymethylphenylpropane. These compounds can be used alone or as mixtures thereof.

The amount of the photopolymerization initiator used is generally in the range of from 0.1 to 5 parts by weight per 100 parts by weight of the base polymer. If the amount of the photopolymerization initiator used is too small, the three-dimensional network structure is formed only insufficiently by the irradiation of the pressure-sensitive adhesive layer with light and reduction in the adhesive force of the thin adhesive sheet to the IC element chip is too small. On the other hand, even if the amount thereof is increased, any further effect cannot be obtained. Rather, the photopolymerization initiator undesirably remains on the surface of the IC element chip. If necessary, amine compounds such as triethylamine, tetraethylpentamine, and dimethylaminoethanol may be used as photopolymerization accelerators in combination with the above-described photopolymerization initiators.

The pressure-sensitive adhesive composition composed of the above-described components is coated on the light-permeable support and then, if necessary, heated to thereby-form the pressure-sensitive adhesive layer. The thickness of the pressure-sensitive adhesive layer is generally in the range of from about 5 to 70 μm in dry thickness.

The 100% modulus (20° C.) of the pressure-sensitive adhesive layer is generally 10 kg/cm$^2$ or less and preferably from 0.5 to 8 kg/cm$^2$. The gel content therein as determined by immersing in toluene (20° C.) for 24 hours is usually less than 55% by weight, preferably from 0.5 to less than 55% by weight, and more preferably from 35 to less than 55% by weight, and the degree of swelling of gel is generally at least 20 times and preferably from 25 to 80 times.

In cutting and separating the semiconductor wafer into element chips by using the thin adhesive sheet of the present invention, comprising the above-described light-permeable support and pressure-sensitive adhesive layer, the semiconductor wafer is first adhered and fixed to the thin adhesive sheet and the semiconductor wafer is then subjected to semifull or full cutting using a cutting blade such as a rotary blade. The thin adhesive sheet is irradiated with light having a wavelength range of from about 180 to 460 nm from the support side thereof for about 2 to 180 seconds using a high pressure mercury lamp, a super pressure mercury lamp, or the like. The element chips are then picked up and simultaneously mounted in the procedure, for example, such that the element chip is adsorbed with an air pinset simultaneously with application of a physical means such as pushing up with a needle.

In the case that the heat-shrinkable synthetic resin film is used as the support of the thin adhesive sheet, the sheet can be applied under tension by heating the heat-shrinkable synthetic resin film prior to or after fixation of the semiconductor wafer, so that the thin adhesive sheet does not deform during the wafer cutting process and the semiconductor wafer can be cut accurately. In the case that the stretchable synthetic resin or rubber film is used at the support of the adhesive sheet, if the sheet after cutting process is uniformly stretched, fixed, and then irradiated with light under its state, a proper gap is maintained between chips and as a result, the air pinset is prevented from coming into contact with the neighboring chip, thereby scratching the chip during the pick-up operation.

In these procedures, irradiation with light may be applied on the entire surface of the thin adhesive sheet, or only on an area where the semiconductor wafer is bonded to the thin adhesive sheet. In addition, a method comprising irradiating element chips with light one by one successively and then picking up every chip may be employed.

In polishing the back of the semiconductor wafer using the thin adhesive sheet, the thin adhesive sheet of the present invention is applied to the front surface of the semiconductor wafer and the back is polished. Thereafter, before peeling the thin adhesive sheet, the pressure-sensitive adhesive layer is cured by irradiating with light from the support side, thereby forming the three-dimensional network structure. Due to the formation of the three-dimensional network structure, the cohesive force of the adhesive layer increases and the adhesiveness thereof substantially loses, resulting in a marked reduction in adhesive force of the thin adhesive sheet to the semiconductor wafer. Therefore, regardless of the surface condition of the semiconductor wafer, the thin adhesive sheet can be peeled off easily.

The 180° peeling adhesion force (peeling speed: 300 mm/min) of the thin adhesive sheet to the semiconductor wafer prior to irradiation with light is generally at least 200 g/20 mm, preferably from 200 to 1,800 g/20 mm, and more preferably from 200 to 1,000 g/20 mm. Thus, even under a hydraulic pressure of about 2 kg/cm$^2$ which is generally applied during the wafer cutting process, the element chips never drop from the thin adhesive sheet.

When the pressure-sensitive adhesive layer is irradiated with light, the photopolymerizable compound is polymerized and at the same time, free radicals are generated in the base polymer, and the thus-excited base polymer reacts with the photopolymerizable compound. As a result, the pressure-sensitive adhesive layer is cured, thereby forming the three-dimensional network structure.

The term "three-dimensional network structure" as used herein means that the gel content as determined by immersing the pressure-sensitive adhesive layer in toluene (20° C.) for 24 hours is at least about 1.05 times, preferably at least about 1.2 times, and more preferably at least about 1.4 times the gel content before irradiation with light, and is at least 55% by weight, preferably at least 60% by weight, and more preferably at least 70% by weight. The pressure-sensitive adhesive layer irradiated with light has generally the degree of swelling of gel determined above of 18 times or less and preferably from 5 to 15 times.

Due to the formation of the three-dimensional network structure, the cohesive force of the pressure-sensitive adhesive layer is markedly increased as compared with that prior to irradiation with light. The 100% modulus (20° C.) is generally increased to at least 20 kg/cm$^2$, preferably from 25 to 150 kg/cm$^2$, and more preferably from 28 to 100 kg/cm$^2$. As a result, the adhesiveness of the pressure-sensitive adhesive layer is substantially lost and the adhesive force of the thin adhesive sheet to element chips markedly decreases. At this time, the 180° peeling adhesion force (peeling speed: 300 mm/min) is generally 150 g/20 mm or less, and preferably from 5 to 125 g/20 mm. Therefore, even if the size of the element chip is more than 50 mm$^2$, the element chips can be easily picked up from the thin adhesive sheet.

The present invention is described in greater detail by reference to the following non-limiting examples. All parts are by weight.

EXAMPLE 1

A composition of 100 parts of butyl acrylate, 5 parts of acrylonitrile, and 5 parts of acrylic acid was copolymerized in toluene to obtain an acrylic copolymer having a number average molecular weight of 300,000.

To 100 parts of the acrylic copolymer were added 5 parts of a polyisocyanate compound (trade name: "CORONATE L", produced by Nippon Polyurethane Co., Ltd.), 15 parts of dipentaerythritol monohydroxypentaacrylate, and 1 part of a-hydroxycyclohexyl phenyl ketone, and they were mixed to prepare a pressure-sensitive adhesive composition.

This composition was coated on one surface of a 50 μm thick polyethylene terephthalate film in a thickness of 10 μm and then dried at 130° C. for 3 minutes to obtain a thin adhesive sheet for working semiconductor wafers.

EXAMPLE 2

To 100 parts of the same acrylic copolymer as prepared in Example 1 were added 5 parts of the same polyisocyanate compound as used in Example 1, 20 parts of pentaerythritol triacrylate, and 0.5 part of isobutyl benzoin ether, and they were mixed to prepare a pressure-sensitive adhesive composition. This composition was processed in the same manner as in Example 1 to obtain a thin adhesive sheet.

EXAMPLE 3

To 100 parts of the same acrylic copolymer as prepared in Example 1 were added 5 parts of the polyisocyanate compound as used in Example 1, 10 parts of dipentaerythritol monohydroxypentaacrylate, 1 part of dimethylthioxanthone, and 1 part of triethylamine, and they were mixed to prepare a pressure-sensitive adhesive composition. This composition was processed in the same manner as in Example 1 to obtain a thin adhesive sheet.

EXAMPLE 4

A composition of 100 parts of butyl acrylate and 7.5 parts of acrylic acid was copolymerized in toluene to prepare an acrylic copolymer having a number average molecular weight of 300,000. Thereafter, the same manner as in Example 1 was followed except that the above-prepared acrylic copolymer was used as the copolymer, to obtain a thin adhesive sheet.

EXAMPLE 5

A thin adhesive sheet was obtained in the same manner as in Example 1 except that 40 parts of 1,6-hexanediol diacrylate was used in place of 15 parts of dipentaerythritol monohydroxypentaacrylate.

EXAMPLE 6

A thin adhesive sheet was obtained in the same manner as in Example 1 except that 50 parts of a poly-functional oligoester acrylate (trade name, "ARONIX M-8030", produced by Toa Gosei Kagaku Kogyo K.K.) was used in place of 15 parts of dipentaerythritol monohydroxy pentaacrylate.

COMPARATIVE EXAMPLE

For the sake of comparison, a thin adhesive sheet was obtained in the same manner as in Example 1 except that 15 parts of dipentaerythritol monohydroxy pentaacrylate and 1 part of α-hydroxycyclohexyl phenyl ketone were not used.

TEST EXAMPLE 1

A semiconductor wafer having a diameter of 5 inches was bonded to each thin adhesive sheet obtained in Examples 1 to 6 and Comparative Example, and the assembly was then cut into element chips having a size of 50 mm$^2$ using a rotary blade. This wafer cutting process was carried out while washing with water under a hydraulic pressure of 2 kg/cm$^2$. In all the thin adhesive sheets, any element chip did not drop.

After the wafer cutting process, the thin adhesive sheet was irradiated with light from the support side thereof for 20 seconds using a high pressure mercury lamp (40 W/cm) placed at a distance of 15 cm. Element chips were picked up by pushing up those using a needle while simultaneously adsorbing with an air pinset.

In the thin adhesive sheets obtained in Examples 1 to 6, the element chips could be easily picked up and furthermore the pressure-sensitive adhesive layer was not transferred at all to the element chips. On the other hand, in the case of the thin adhesive sheet obtained in Comparative Example, the element chips remained bonded firmly to the thin adhesive sheet and could not be picked up.

TEST EXAMPLE 2

180° Peeling Adhesion Force:

The thin adhesive sheets obtained in Examples 1 to 6 and Comparative Example were measured for the 180° peeling adhesion force (peeling speed: 300 mm/min) to the semiconductor wafer. Similarly, after the thin adhesive sheet was bonded to the semiconductor wafer and irradiated with light from the support side thereof under the same conditions as in Test Example 1, the adhesion force was measured.

100% Modulus:

A 50 μm thick polyethylene terephthalate film liner was coated with each pressure-sensitive adhesive composition in a thickness of 10 μm, heated at 130° C. for 3 minutes, cut into pieces having a size of 50 mm×50 mm, and collected into a bar-like form to prepare a yarn-like test piece having a cross sectional area of 0.5 mm². This test piece was measured for 100% modulus at 20° C. Further, another piece cut into a size of 50 mm×50 mm was irradiated with light under the same conditions as in Test Example 1. The text piece thus treated was collected into a bar-like form in the same manner as above and measured for 100% modulus.

Gel Content and Degree of Swelling of Gel:

After coating and heating each pressure-sensitive adhesive composition in the same manner as in the preparation of the test piece for measurement of 100% modulus, a test piece having a size of 50 mm×500 mm was cut out. This test piece was immersed in toluene (20° C.) for 24 hours to measure the gel content and the degree of swelling of gel. Further, another piece cut into a size of 50 mm×500 mm was irradiated with light the same conditions as in Test Example 1. The test piece thus treated was immersed in toluene for 24 hours to measure the gel content and the degree of swelling of gel.

The results obtained are shown in the Table below. In the Table, the measurement values prior to irradiation with light are shown in column A, and the measurement values after irradiation with light, in Column B.

TABLE

| Run No. | 180° Peeling Adhesion Force (g/20 mm) | | 100% Modulus (kg/cm²) | | Gel Fraction (wt %) | | Degree of Swelling of Gel (times) | |
|---|---|---|---|---|---|---|---|---|
| | A | B | A | B | A | B | A | B |
| Example 1 | 500 | 30 | 2.0 | 60 | 50 | 85 | 25 | 10 |
| Example 2 | 530 | 70 | 3.0 | 80 | 50 | 85 | 28 | 12 |
| Example 3 | 300 | 25 | 4.0 | 85 | 50 | 80 | 26 | 8 |
| Example 4 | 800 | 35 | 0.5 | 30 | 40 | 70 | 20 | 10 |
| Example 5 | 340 | 100 | 1.5 | 50 | 40 | 65 | 30 | 13 |
| Example 6 | 320 | 120 | 2.0 | 55 | 40 | 65 | 35 | 15 |
| Comparative Example | 350 | 800 | 2.0 | 3.0 | 52 | 55 | 23 | 20 |

EXAMPLE 7

The thin adhesive sheet obtained in Example 1 except that the thickness of the adhesive lay was 30 μm was bonded to the surface of a semiconductor wafer having a diameter of 5 inches and a thickness of 0.5 mm with IC elements formed on the surface thereof. The of the wafer was polished using surface grinder. In this polishing, the semiconductor wafer was neither broken nor cracked, and the surface of the semiconductor wafer was not scratched. Moreover, the permeation of water between the semiconductor wafer and the adhesive sheet did not occur.

After the polishing process, the adhesive sheet was irradiated with light for 20 seconds from the polyethylene terephthalate film side using a high pressure mercury lamp (40 W/cm) placed at a distance of 15 cm and then peeled off from the semiconductor wafer. This peeling could be performed very easily, and the transfer of the pressure-sensitive adhesive layer to the surface of the semiconductor wafer was not observed at all. The thus-polished semiconductor wafer had a thickness of 0.25 cm and an entire uniform thickness. The 180° peeling adhesive force of the adhesive sheet was 350 g/20 mm prior to irradiation with light and 35 g/20 mm after irradiation with light.

It can be seen from the above results that when the thin adhesive sheet of the present invention is used in working the semiconductor wafer, element chips obtained by cutting the semiconductor wafer are firmly bonded to the thin adhesive sheet and never drop from the thin adhesive sheet during the wafer cutting process, and after the wafer cutting process, the element chips can be easily picked up by irradiation of the thin adhesive sheet with light from the support side even though the size of the element chip is more than 50 mm². Furthermore, in the polishing step, the semiconductor wafer can be polished efficiently and the thin adhesive sheet can be easily peeled off.

The reason why the element chips can be easily picked up and after polishing, and the thin adhesive sheet can be easily peeled off can be understood from the fact that the cohesive force of the pressure-sensitive adhesive layer markedly increases due to the formation of the three-dimensional network structure by irradiation of the thin adhesive sheet with light and as a result, the adhesive force of the thin adhesive sheet to the element chips markedly decreases.

While the invention has been described in detail and with reference to specific embodiments thereof, it will be apparent to one skilled in the art that various changes and modifications can be made therein without departing from the spirit and scope thereof.

What is claimed is:

1. A thin adhesive sheet comprising a light-permeable support having provided thereon an acrylic-based pressure-sensitive adhesive layer which comprises an acryl base polymer, a crosslinking agent, a low molecular weight photopolymerizable compound and a photopolymerization initiator, wherein the low molecular weight photopolymerizable compound is present in an amount of from 1 to 100 parts by weight per 100 parts by weight of the acryl base polymer, and the photopolymerization initiator is present in an amount of from 0.1 to 5 parts by weight per 100 parts by weight of the acryl base polymer, the acrylic-based pressure-sensitive adhesive layer being formed by heating a liquid composition, wherein after said heating the photopolymerization initiator is present in the acrylic-based pressure sensitive adhesive layer until a subsequent irradiation with light, whereupon the acryl base polymer reacts with the photopolymerizable compound to form a three-dimensional network structure, wherein the cohesive force of the acrylic-based pressure-sensitive adhesive layer is increased as compared to the adhesive force of the acrylic-based pressure-sensitive adhesive layer prior to irradiation with light, whereupon the adhesiveness of the acrylic-based pressure-sensitive adhesive layer is substantially lost, said acrylic-based pressure-sensitive adhesive layer containing a gel prior to irradiation with light and a gel after irradiation with light, wherein the degree of swelling of the gel contained in the acrylic-based pressure-sensitive adhesive layer prior to irradiation with light is 35 times or less and the degree of swelling of the gel after irradiation with light is at most 18 times and the degree of swelling of the gel after irradiation with light is smaller than the degree of swelling of the gel prior to irradiation with light, wherein the light-permeable support has a thickness of from 10 to 300 μm and wherein a 180° peeling adhesion force prior to irradiation with light is at least 200 g/20 mm and the 180° peeling adhesion force after irradiation with light is 150 g/20 mm or less.

2. The thin adhesive sheet as in claim 1, wherein the light-permeable support is a film made of a polyolefin resin.

3. The thin adhesive sheet as in claim 1, wherein the pressure-sensitive adhesive layer comprises the acrylic-based polymer, a low molecular weight compound having at least two photopolymerizable carbon—carbon double bonds in the molecule and a photopolymerization initiator.

* * * * *